United States Patent [19]
Jeang

[11] Patent Number: 5,596,616
[45] Date of Patent: Jan. 21, 1997

[54] BURST ADDRESS SEQUENCE GENERATOR FOR ADDRESSING STATIC RANDOM-ACCESS-MEMORY DEVICES

[75] Inventor: Fuh-Hwang Jeang, Hsinchu Hsien, Taiwan

[73] Assignee: United Microelectronics Corp., Hsinchu, Taiwan

[21] Appl. No.: 597,388

[22] Filed: Feb. 8, 1996

[51] Int. Cl.$^6$ .................................................. H03K 21/08
[52] U.S. Cl. ............................................................. 377/56
[58] Field of Search ................................................. 377/56

[56] References Cited

U.S. PATENT DOCUMENTS 5,319,759  6/1994  Chan ...................................... 395/400

Primary Examiner—Margaret Rose Wambach
Attorney, Agent, or Firm— Ladas & Parry

[57] ABSTRACT

A burst address sequence generator includes a counter, a latch and an exclusive-OR gate. The counter is controlled by a mode signal for generating count values. The latch generates pre-address signals. The count values and the pre-address signals are received by the exclusive-OR gate generate a burst address sequence.

7 Claims, 6 Drawing Sheets

BURST ADDRESS SEQUENCE GENERATOR FOR ADDRESSING STATIC RANDOM-ACCESS-MEMORY DEVICES

BACKGROUND OF THE INVENTION

1. Field of the Invention

The present invention relates to a memory device in a computer system, and more specifically, to a burst address sequence generator for addressing a static random-access-memory (SRAM) device.

2. Description of Prior Art

A synchronous SRAM device is generally utilized as a cache memory in a microcomputer system. In order to access data in the cache memory, an address sequence generator has to be provided in the microcomputer system to generate address sequences, called burst addresses. The burst address sequences have a format in conformity with the operating mode of a microprocessor of the computer system. Since there are at least two operating modes for a commercial microprocessor, the burst address sequences have to be provided with two formats, including an interleaved format and a linear format. Therefore, the burst address sequence generator should be controlled by a mode signal to generate both the interleaved and linear burst address sequences.

The interleaved burst addresses, if initialized, have the formats shown in Table 1.

TABLE 1

| 1st address (external) | 2nd address (internal) | 3rd address (internal) | 4th address (internal) |
| --- | --- | --- | --- |
| X ... X00 | X ... X01 | X ... X10 | X ... X11 |
| X ... X01 | X ... X00 | X ... X11 | X ... X10 |
| X ... X10 | X ... X11 | X ... X00 | X ... X01 |
| X ... X11 | X ... X10 | X ... X01 | X ... X00 |

The formats of the linear burst address sequences are shown Table 2.

TABLE 2

| 1st address (external) | 2nd address (internal) | 3rd address (internal) | 4th address (internal) |
| --- | --- | --- | --- |
| X ... X00 | X ... X01 | X ... X10 | X ... X11 |
| X ... X01 | X ... X10 | X ... X11 | X ... X00 |
| X ... X10 | X ... X11 | X ... X00 | X ... X01 |
| X ... X11 | X ... X00 | X ... X01 | X ... X10 |

A conventional burst address sequence generator has been disclosed in U.S. Pat. No. 5,319,759. The conventional burst address sequence generator includes a counter and a latch. However, the prior art circuit structure may be too complicated to be implemented in a semiconductor very large scale integrated (VLSI) circuit.

SUMMARY OF THE INVENTION

Accordingly, the present invention provides a burst address sequence generator to facilitate implementation in a VLSI circuit application.

The present invention also provides a burst address sequence generator, driven by clock signals of specific timing, for generating an interleaved and a linear burst address sequence under the control of a mode signal.

The burst address sequence generator of the present invention includes a counter, a latch and an exclusive-OR gate.

The counter, which is controlled by a mode signal for generating count values, is composed of a first multiplexer, a first flip-flop, a second multiplexer, a second flip-flop and a logic gate. The first multiplexer is controlled by an inverse signal of the mode signal and driven by a first clock signal for outputting a signal which is selected from the external address signal and a zero value. The first flip-flop is preset by the first multiplexer and driven by a second clock signal. The second multiplexer is controlled by the inverse signal of the mode signal and is driven by the first clock signal for outputting a signal which is selected from the external address signal and a zero value. The second flip-flop is preset by the second multiplexer and is driven by the second clock signal. The inverse output end of the second flip-flop is connected to its input end. The logic gate receives output signals of the first flip-flop and the second flip-flop and connects its output end to input end of the first flip-flop.

The latch, which includes a third multiplexer, a third flip-flop, a fourth multiplexer and a fourth flip-flop, generates pre-address signals. The third multiplexer is controlled by the mode signal for outputting a signal selected from the external address signal and a zero value. The third flip-flop receives the signal outputted from the third multiplexer and is driven by an inverse signal of the first clock signal. The fourth multiplexer is controlled by the mode signal for outputting a signal selected from the external address signal and a zero value. The fourth flip-flop receives the signal outputted from the fourth multiplexer and is driven by the inverse signal of the first clock signal.

The count values and the pre-address signals are received by the exclusive-OR gate to generate a burst address sequence. Since the count values are controlled by the mode signal, the burst address sequence can have either the interleaved or the linear format. That is, when the mode signal is high, the burst address sequence has the interleaved format shown in Table 1. On the other hand, when the mode signal is low, the burst address sequence has the linear format of Table 2.

Other objects, features, and advantages of the present invention will become apparent from the following detailed description of the preferred but non-limiting embodiment.

BRIEF DESCRIPTION OF THE DRAWINGS

The detailed description is made with reference to the accompanying drawings in which.

DETAILED DESCRIPTION OF THE PREFERRED EMBODIMENT

Figure 1:
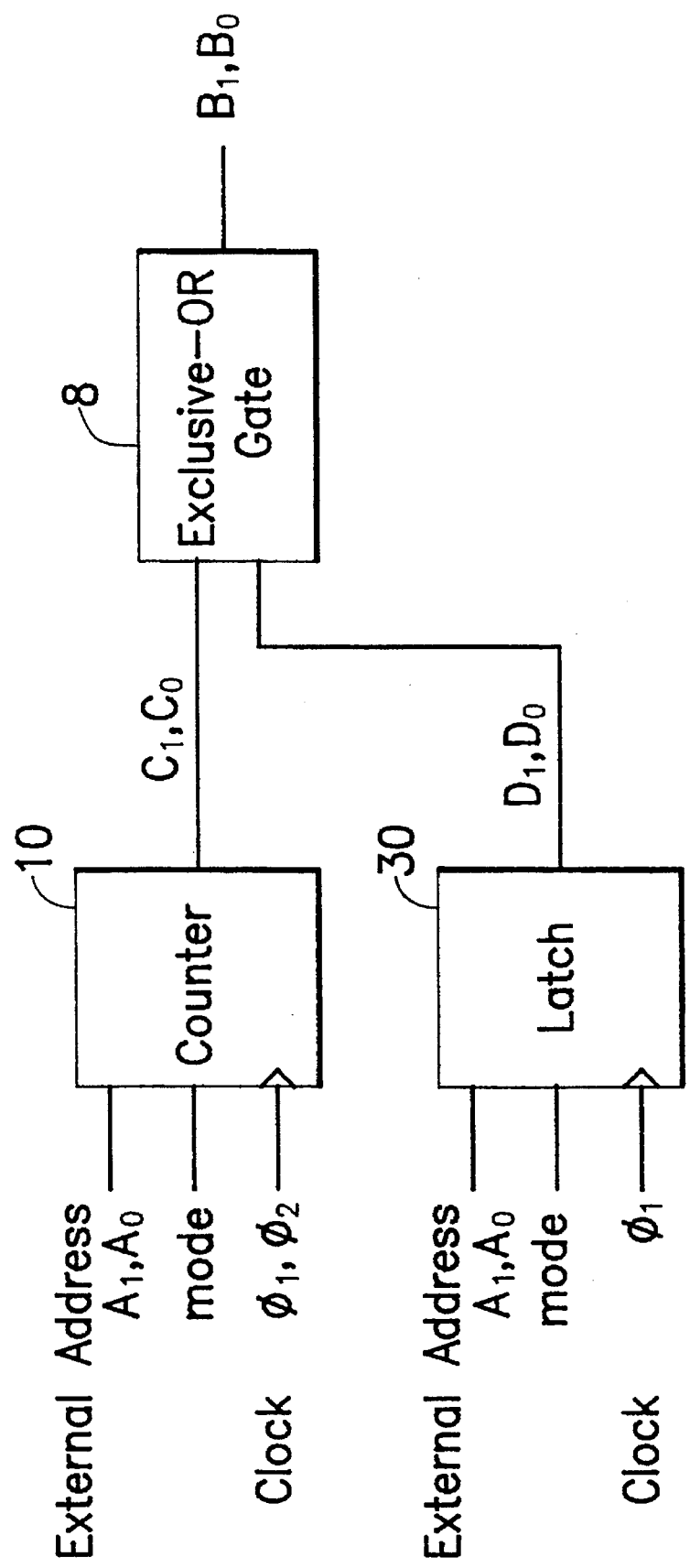
FIG. 1 is a block diagram of the burst address sequence generator.

The burst address sequence generator of the present invention includes a counter and a latch. A block diagram of the burst address sequence generator is depicted in FIG. 1. Referring to FIG. 1, counter 10 and latch 30 both receive external address signals $A_1$ and $A_0$ and are driven by first clock signal $\phi_1$ and counter 10 is also driven by second clock signal $\phi_2$ to output signals $C_0$, $C_1$, $D_0$ and $D_1$. These signals are then sent to exclusive-OR gate 8 to generate burst address sequence $B_1$ and $B_0$. In order to generate the two different address formats shown in Table 1 and Table 2, counter 10 and latch 30 are further controlled by mode signal mode to select either external address signals $A_1$ and $A_0$ or a zero value (e.g. a grounded value) as initial values.

Figure 2:
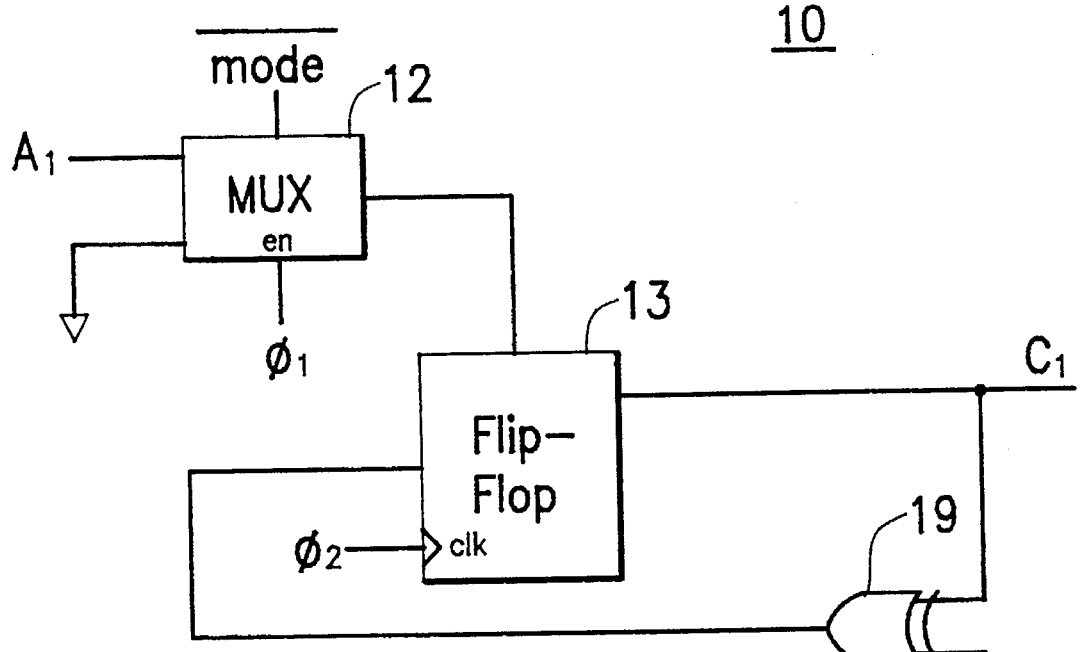
FIG. 2 is a circuit diagram of the counter in the burst address sequence generator.
Figure 2:
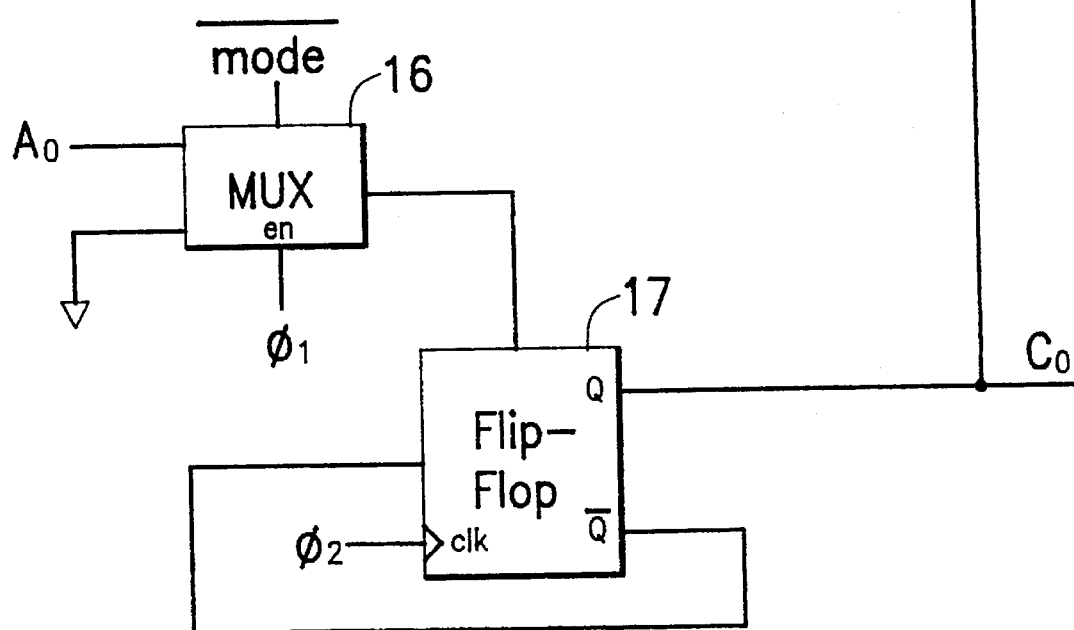

Counter 10 of the present invention can have a structure depicted in FIG. 2. As shown in the figure, counter 10 includes first multiplexer 12, first flip-flop 13, second multiplexer 16, second flip-flop 17 and exclusive-OR gate 19. First multiplexer 12 is controlled by an inverse signal of signal mode (i.e., signal $\overline{\text{mode}}$), and is driven by first clock signal $\phi_1$ to output a signal selected from external address signal $A_1$ and the zero value. The output signal of first multiplexer 12 is provided for presetting first flip-flop 13 which is driven by an inverse signal of second clock signal $\phi_2$, i.e., signal $\overline{\phi_2}$. Second multiplexer 16 is controlled by signal $\overline{\text{mode}}$ and is driven by first clock signal $\phi_1$ to output a signal selected from external address signal $A_0$ and the zero value. Second flip-flop 17 is preset by the output signal of second multiplexer 16 and is driven by clock signal $\overline{\phi_2}$. Second flip-flop 17 has its inverse output end $\overline{Q}$ connected to the input end. Exclusive-OR gate 19 has two input ends which are connected to output ends Q of first flip-flop 13 and second flip-flop 17, respectively. The exclusive-OR result is then sent to input end of first flip-flop 13.

As driven by clock signals $\phi_1$ and $\overline{\phi_2}$, the count values generated by counter 10, including value $C_1$ from output end Q of first flip-flop 13 and value $C_0$ from output end Q of second flip-flop 17, will have a format which repeats the sequence of {00, 01, 10 and 11} when signal mode is a high level signal. Alternatively, when signal mode is a low level signal, count value $C_1C_0$ in the first clock period will be external address signal $A_1A_0$, and then followed by values having the order of . . . , 00, 01, 10, 11, 00, 01, . . . and so on.

Figure 3:
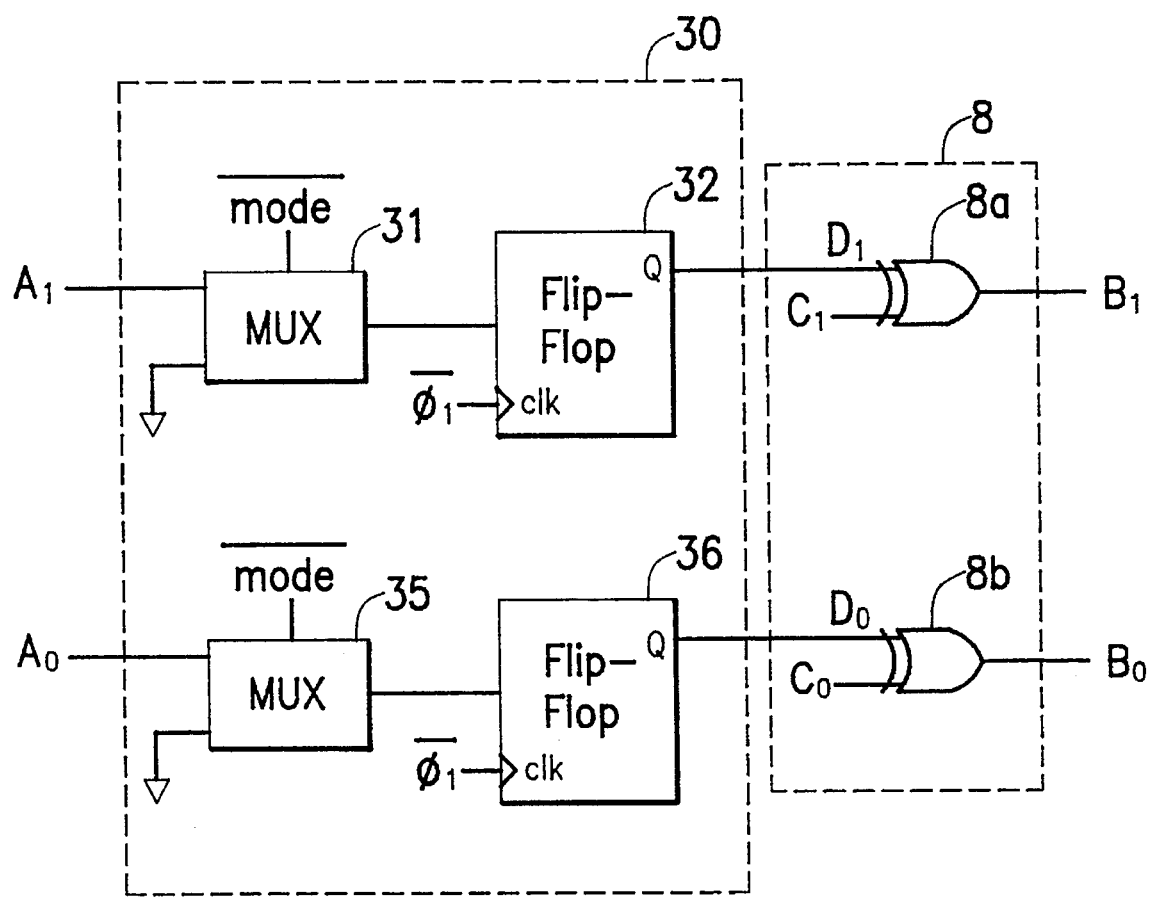
FIG. 3 is a circuit diagram of the latch in the burst address sequence generator.

FIG. 3 illustrates the structure of latch 30. Latch 30 includes third multiplexer 31, third flip-flop 32, fourth multiplexer 35 and fourth flip-flop 36. Third multiplexer 31 is controlled by mode signal mode to output either external address $A_1$ or the zero value. Third flip-flop 32 is driven by an inverse signal of first clock signal $\phi 1$, i.e., signal $\overline{\phi_1}$ to generate pre-address $D_1$. Fourth multiplexer 35 is controlled by signal mode to output either external address $A_0$ or the zero value. Fourth flip-flop 36 is also driven by clock signal $\overline{\phi_1}$ to generate pre-address $D_0$. Therefore, when signal mode is high, pre-address signals $D_1D_0$ are equivalent to external address signals $A_1A_0$, and when signal mode is low, pre-address signals $D_1D_0$ have values "00".

Pre-address signals $D_1$ and $D_0$ in accompaniment with count values $C_1$ and $C_0$ are sent to exclusive-OR gates 8a and 8b to generate burst address $B_1$ and $B_0$. Since the sequences of count values $C_1$ and $C_0$ are controlled by mode signal mode, burst address $B_1$ and $B_0$ can have either the interleaved or the linear format accordingly. That is, when signal mode is high, burst address sequences $B_1B_0$ have the interleaved format shown in Table 1, or when signal mode is low, burst address sequences $B_1B_0$ have the linear format of Table 2.

Figure 4:
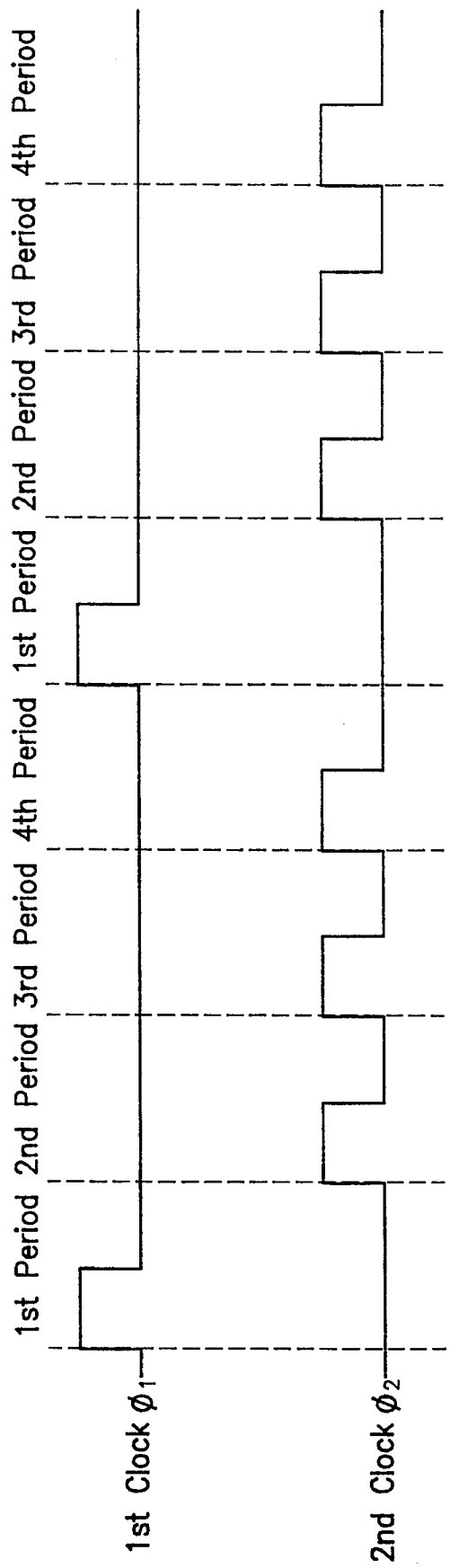
FIG. 4 is a timing diagram illustrating the relationships of the clock signals utilized in the present invention.

Clock signals $\phi_1$ and $\phi_2$ of the present invention have the timing relationships shown in FIG. 4. They repeat a four-period cycle to drive the burst address sequence generator. For each four-period cycle, first clock signal $\phi_1$ is provided with only one pulse in the first period. It is a low level signal in the second, the third and the fourth periods. For second clock signal $\phi_2$, on the contrary, a pulse exists in each of the second, the third and the fourth periods, while there is no pulse in the first period. For both first clock signal $\phi_1$ and second clock signal $\phi_2$, it is preferable to provide a pulse width of about one half of each period, and the pulse should preferably occur in the beginning of each period.

Figure 5:
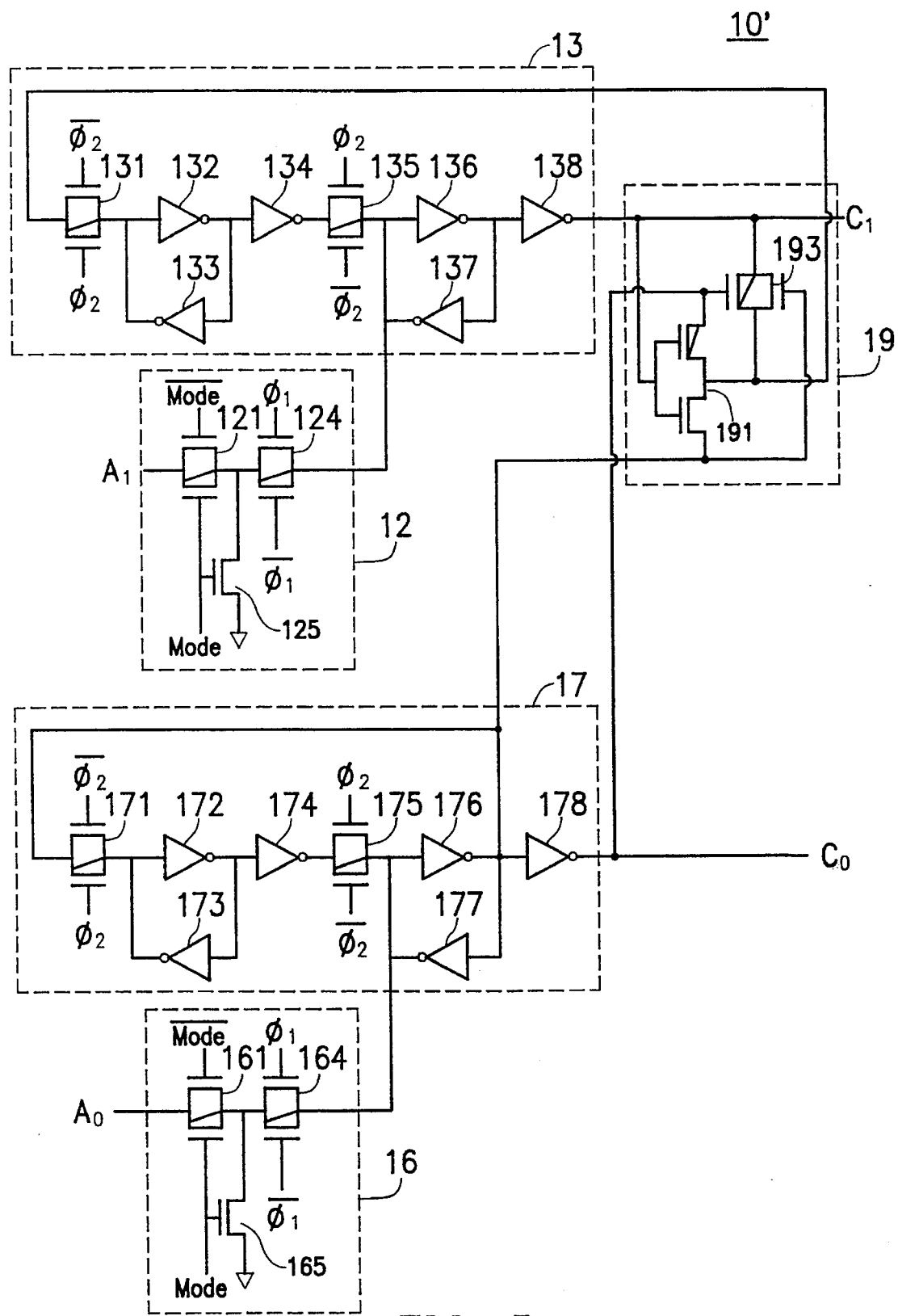
FIG. 5 illustrates a preferred counter circuit of the burst address sequence generator of the present invention.
Figure 6:
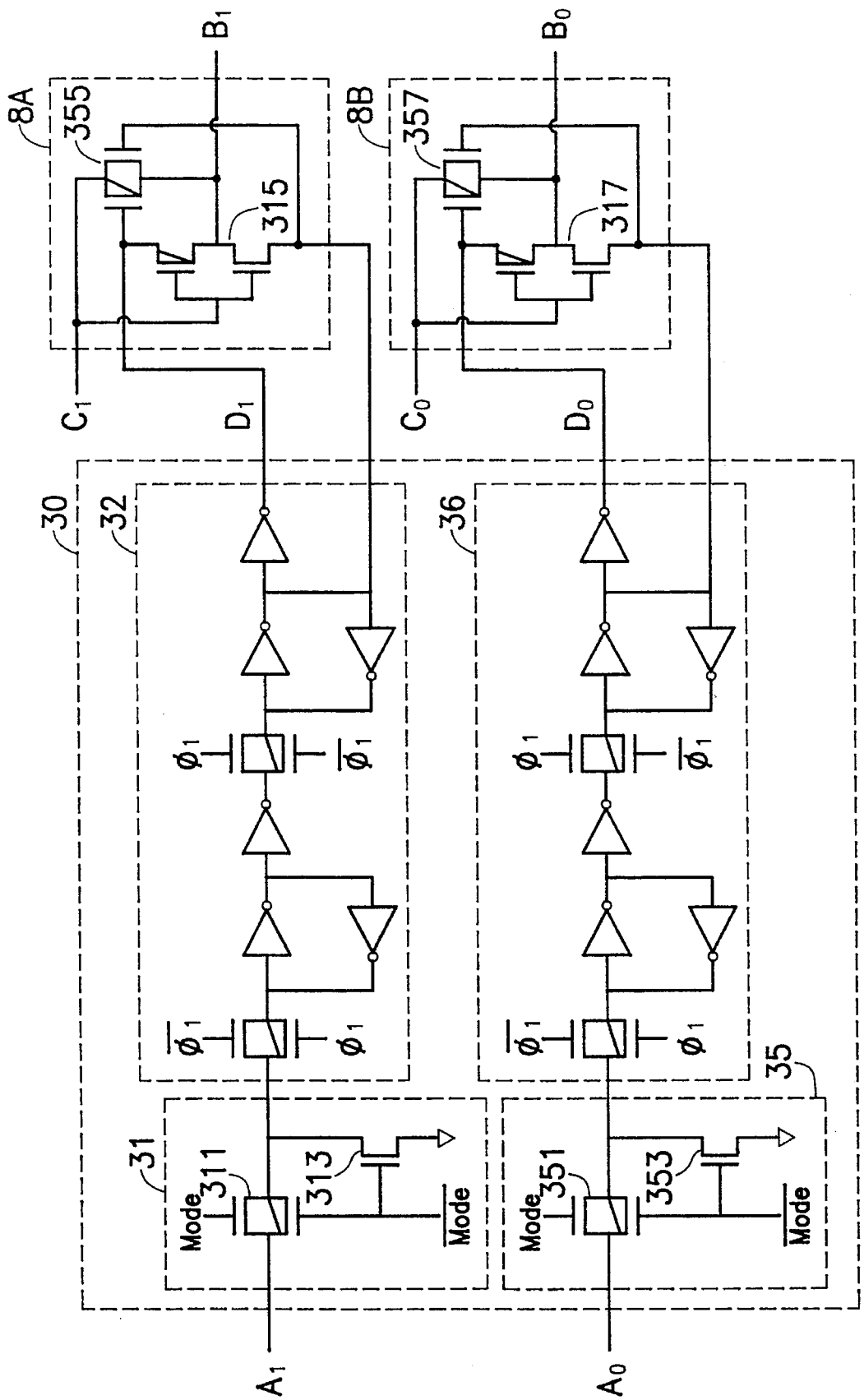
FIG. 6 illustrates a preferred latch circuit of the burst address sequence generator of the present invention.

The circuit diagrams of FIG. 5 and FIG. 6 depict the burst address sequence generator of the present invention in more detail. FIG. 5 depicts the detailed circuit structure of counter 10. FIG. 6 depicts the circuit structure of latch 30.

Referring to FIG. 5 (and FIG. 2, for clarity), first flip-flop 13 and second flip-flop 17 each consist of two portions, that is, a master portion and a slave portion. For example, the master portion of first flip-flop 13 includes transmission gate 131 and a number of inverters 132 through 134. Transmission gate 131 is controlled by signal $\overline{\phi_2}$. The input end of inverters 132 and the output end of inverter 133 are connected to transmission gate 131. Both inputs of inverters 133 and 134 are connected to the output of inverter 132. The slave portion of first flip-flop 13 includes transmission gate 135 and a number of inverters 136 through 138 which are connected in a similar manner to that of the master portion, except that transmission gate 135 is controlled by second clock signal $\phi_2$. The circuit structure of second flip-flop 17, including transmission gates 171 and 175 and inverters 172–174 and 176–178, is similar to that of first flip-flop 13.

First multiplexer 12 consists of two transmission gates 121 and 124 and pull-down element 125 which is grounded. Transmission gate 121 is controlled by signal $\overline{\text{mode}}$ for either providing a passage for external address signal $A_1$ or maintaining the zero value by way of the pull-down element. Transmission gate 124 is controlled by first clock signal $\phi_1$ to transmit address signal $A_1$ or the zero value to the slave portion of first flip-flop 13. Second multiplexer 16, consisting of two transmission gates 161 and 164 and pull-down element 165, is similar to first multiplexer 12. Exclusive-OR gate 19, as shown in FIG. 5, is composed of CMOS switch 191 and transmission gate 193.

Referring to FIG. 6, third flip-flop 32 and fourth flip-flop 36 of latch 30 are constructed in the manner similar to that of counter 10. The transmission gate in the master portion of third flip-flop is controlled by clock signal $\overline{\phi_1}$, while that in the slave portion is controlled by clock signal $\phi_1$. Multiplexers 31 and 35 are each composed of transmission gates 311, 351 respectively along with pull-down elements 313, 353 respectively. they consist essentially of MOS transistors. Transmission gate 311 (351) of multiplexer 31 (35) is controlled by mode signal mode for either providing a passage for external address signal $A_1$ ($A_2$) or maintain the zero value through the pull-down element. Exclusive-OR gates 8a and 8b, consisting of CMOS transistors 315, 355 and transmission gates 317, 357, respectively, are also shown in the figure.

In the aforementioned burst address sequence generator, pre-address signals $D_1D_0$ are equivalent to external address signals $A_1A_0$ and are latched by latch 30 when mode signal mode is high. Therefore, interleaved address sequences $B_1B_0$ can be generated through exclusive-OR gates 8a and 8b. The interleaved address sequences can be utilized in computer systems whose microprocessors are INTEL-compatible. Alternatively, pre-address signals $D_1D_0$ equal "00" when mode signal mode is low. Linear burst address sequences $B_1B_0$ can be generated by exclusive-OR calculation of pre-address signals $D_1D_0$ and count values $C_1C_0$. These address sequences are suitable for computer systems such as the IBM POWER PC.

What is claimed is:

1. A burst address sequence generator for a static random-access-memory device, comprising:

a counter, controlled by a mode signal, the counter including:
- a first multiplexer, controlled by an inverse signal of said mode signal, driven by a first clock signal, for outputting a signal which is either an external address signal or a zero value;
- a first flip-flop, preset by the output signal of said first multiplexer, driven by a second clock signal, for outputting a count value;
- a second multiplexer, controlled by said inverse signal of said mode signal, driven by said first clock signal, for outputting a signal which is either the external address signal or a zero value;
- a second flip-flop, preset by the output signal of said second multiplexer, driven by said second clock signal, for outputting a count value, an inverse output end of the second flip-flop being connected to an input end thereof, and
- a counter exclusive-OR gate, receiving said count values of said first flip-flop and said second flip-flop for providing an output to the input end of said first flip-flop;

a latch, controlled by said mode signal, the latch including
- a third multiplexer, controlled by said mode signal, outputting a signal selected from said external address signal and a zero value;
- a third flip-flop, receiving the output signal of said third multiplexer, driven by an inverse signal of said first clock signal, for generating a pre-address signal;
- a fourth multiplexer, controlled by said mode signal, outputting a signal selected from said external address signal and a zero value; and
- a fourth flip-flop, receiving the output signal of said fourth multiplexer, driven by said inverse signal of said first clock signal, for generating a pre-address signal;

and a generator exclusive-OR gate, receiving said count values and said pre-address signals, for generating a burst address sequence.

2. The burst address sequence generator of claim 1, wherein said first clock signal and said second clock signal repeat a four-period cycle, said first clock signal having only one pulse in a first period, said second clock signal having pulses in each of a second, a third and a fourth period, each said pulse having a width of about one half of each period, and each said pulse occurring in the beginning of the period.

3. The burst address sequence generator of claim 1, wherein said burst address sequence is an interleaved burst address sequence when said mode signal is a high level signal.

4. The burst address sequence generator of claim 1, wherein said burst address sequence is a linear burst address sequence when said mode signal is a low level signal.

5. The burst address sequence generator of claim 1, wherein each multiplexer includes a transmission gate.

6. The burst address sequence generator of claim 1, wherein each flip-flop includes a master portion and a slave portion, both said master portion and said slave portion including a transmission gate and a number of inverters.

7. The burst address sequence generator of claim 1, wherein said each exclusive-OR gate includes a CMOS switch and a transmission gate.

* * * * *